US009548251B2

(12) United States Patent
Khan et al.

(10) Patent No.: US 9,548,251 B2
(45) Date of Patent: Jan. 17, 2017

(54) SEMICONDUCTOR INTERPOSER HAVING A CAVITY FOR INTRA-INTERPOSER DIE

(75) Inventors: Rezaur Rahman Khan, Rancho Santa Margarita, CA (US); Sam Ziqun Zhao, Irvine, CA (US); Pieter Vorenkamp, Laguna Niguel, CA (US); Kevin Kunzhong Hu, Irvine, CA (US); Sampath K. V. Karikalan, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 2 days.

(21) Appl. No.: 13/349,045

(22) Filed: Jan. 12, 2012

(65) Prior Publication Data
US 2013/0181354 A1 Jul. 18, 2013

(51) Int. Cl.
*H01L 23/48* (2006.01)
*H01L 23/13* (2006.01)
(Continued)

(52) U.S. Cl.
CPC ......... *H01L 23/13* (2013.01); *H01L 23/49833* (2013.01); *H01L 25/0657* (2013.01); *H01L 23/49827* (2013.01); *H01L 2224/14181* (2013.01); *H01L 2224/16145* (2013.01); *H01L 2224/16225* (2013.01); *H01L 2224/16235* (2013.01); *H01L 2224/17181* (2013.01); *H01L 2224/32225* (2013.01); *H01L 2224/73253* (2013.01); *H01L 2225/06513* (2013.01); *H01L 2225/06517* (2013.01); *H01L 2225/06548* (2013.01); *H01L 2225/06572* (2013.01);
(Continued)

(58) Field of Classification Search
CPC ........... H01L 25/0657; H01L 23/49827; H01L 23/5389; H01L 24/97; H01L 2224/16225; H01L 2224/16271
USPC .................. 257/686, 109, E23.172, E21.575, 257/770–779
See application file for complete search history.

(56) References Cited

U.S. PATENT DOCUMENTS 5,198,963 A 3/1993 Gupta
6,002,168 A 12/1999 Bellaar
(Continued)

FOREIGN PATENT DOCUMENTS

KR 10-2011-0036249 4/2011

*Primary Examiner* — Ermias Woldegeoergis
(74) *Attorney, Agent, or Firm* — McDermott Will & Emery LLP

(57) ABSTRACT

A semiconductor package may include a substrate, and a semiconductor interposer having a cavity and a plurality of through semiconductor vias. The semiconductor interposer is situated over the substrate. An intra-interposer die is disposed within the cavity of the semiconductor interposer. A thermally conductive adhesive is disposed within the cavity and contacts the intra-interposer die. Additionally, a top die is situated over the semiconductor interposer. In one implementation, the semiconductor interposer is a silicon interposer. In another implementation, the semiconductor interposer is flip-chip mounted to the substrate such that the intra-interposer die disposed within the cavity faces the substrate. In yet another implementation, the cavity in the semiconductor interposer may extend from a top surface of the semiconductor interposer to a bottom surface of the semiconductor interposer and a thermal interface material may be disposed between the intra-interposer die and the substrate.

28 Claims, 3 Drawing Sheets

(51) Int. Cl.
*H01L 25/065* (2006.01)
*H01L 23/498* (2006.01)

(52) U.S. Cl.
CPC .............. *H01L 2924/157* (2013.01); *H01L 2924/15151* (2013.01); *H01L 2924/15153* (2013.01); *H01L 2924/15311* (2013.01)

(56) References Cited

U.S. PATENT DOCUMENTS

| | | | |
|---|---|---|---|
| 6,031,284 A * | 2/2000 | Song | H01L 23/13 257/686 |
| 6,188,578 B1 | 2/2001 | Lin | |
| 6,306,686 B1 * | 10/2001 | Horton | H01L 23/49811 257/E23.062 |
| 6,461,895 B1 | 10/2002 | Liang | |
| 6,709,898 B1 | 3/2004 | Ma | |
| 6,743,661 B1 | 6/2004 | Drewery | |
| 6,791,195 B2 | 9/2004 | Urushima | |
| 6,921,968 B2 * | 7/2005 | Chung | H01L 21/563 257/686 |
| 7,220,667 B2 | 5/2007 | Yamagata | |
| 7,585,702 B1 | 9/2009 | Wang | |
| 7,675,163 B2 | 3/2010 | Heydari | |
| 7,834,450 B2 | 11/2010 | Kang | |
| 7,838,337 B2 | 11/2010 | Marimuthu | |
| 7,901,986 B2 | 3/2011 | Arai | |
| 8,008,125 B2 * | 8/2011 | McConnelee | H01L 23/5383 257/686 |
| 8,022,555 B2 | 9/2011 | Hwang | |
| 8,133,761 B2 | 3/2012 | Gerber | |
| 8,202,763 B2 | 6/2012 | Meyer | |
| 8,310,063 B2 | 11/2012 | Wang | |
| 8,344,516 B2 | 1/2013 | Chainer | |
| 8,461,672 B2 | 6/2013 | Haba | |
| 2002/0030261 A1 | 3/2002 | Rolda | |
| 2002/0105070 A1 * | 8/2002 | Shibamoto | H01L 23/13 257/712 |
| 2003/0036219 A1 | 2/2003 | Masumoto | |
| 2003/0143781 A1 * | 7/2003 | McLellan | H01L 21/566 438/127 |
| 2003/0151148 A1 * | 8/2003 | Camenforte | H01L 23/36 257/780 |
| 2004/0164390 A1 * | 8/2004 | Wang | H01L 23/13 257/686 |
| 2005/0218518 A1 | 10/2005 | Jiang | |
| 2006/0145328 A1 | 7/2006 | Hsu | |
| 2006/0186531 A1 | 8/2006 | Hsu | |
| 2006/0186536 A1 | 8/2006 | Hsu | |
| 2006/0220262 A1 | 10/2006 | Meyer | |
| 2006/0258044 A1 | 11/2006 | Meyer | |
| 2007/0132082 A1 | 6/2007 | Tang | |
| 2007/0209831 A1 * | 9/2007 | Sakamoto | H01L 21/568 174/262 |
| 2007/0273049 A1 | 11/2007 | Khan | |
| 2007/0290376 A1 | 12/2007 | Zhao | |
| 2008/0044944 A1 | 2/2008 | Wakisaka | |
| 2008/0128882 A1 * | 6/2008 | Baek | H01L 21/568 257/686 |
| 2008/0157322 A1 | 7/2008 | Tang | |
| 2008/0157328 A1 | 7/2008 | Kawata | |
| 2008/0246138 A1 | 10/2008 | Gerber | |
| 2008/0268638 A1 | 10/2008 | Dertinger | |
| 2009/0053858 A1 | 2/2009 | Ko | |
| 2009/0102030 A1 | 4/2009 | Khan | |
| 2010/0019360 A1 | 1/2010 | Khan | |
| 2010/0084754 A1 | 4/2010 | Yoo | |
| 2010/0133534 A1 | 6/2010 | Do | |
| 2010/0301474 A1 | 12/2010 | Yang | |
| 2011/0024888 A1 | 2/2011 | Pagaila | |
| 2011/0024906 A1 | 2/2011 | Meyer | |
| 2011/0068444 A1 * | 3/2011 | Chi | H01L 21/6835 257/669 |
| 2011/0193235 A1 * | 8/2011 | Hu | H01L 21/6835 257/773 |
| 2011/0241185 A1 | 10/2011 | Koester | |
| 2011/0254160 A1 | 10/2011 | Tsai | |
| 2011/0272819 A1 | 11/2011 | Park | |
| 2011/0278732 A1 | 11/2011 | Yu | |
| 2011/0285030 A1 | 11/2011 | Meyer | |
| 2012/0009738 A1 | 1/2012 | Crawford | |
| 2012/0018899 A1 | 1/2012 | Pagaila | |
| 2012/0062439 A1 | 3/2012 | Liao | |
| 2012/0139105 A1 | 6/2012 | Lin | |
| 2012/0152605 A1 | 6/2012 | Das | |
| 2012/0168942 A1 | 7/2012 | Gan | |
| 2012/0211885 A1 | 8/2012 | Choi | |
| 2012/0223429 A1 | 9/2012 | Khan | |
| 2012/0225522 A1 | 9/2012 | Zhao | |
| 2012/0228753 A1 | 9/2012 | Ko | |
| 2012/0241921 A1 | 9/2012 | Lee | |
| 2012/0313240 A1 | 12/2012 | Cheng | |
| 2012/0319293 A1 | 12/2012 | Cheah | |
| 2013/0000968 A1 | 1/2013 | Zhao | |
| 2013/0062764 A1 | 3/2013 | Jin | |
| 2013/0075917 A1 | 3/2013 | Law | |
| 2013/0113098 A1 | 5/2013 | Hwang | |
| 2013/0147023 A1 | 6/2013 | Lin | |

\* cited by examiner

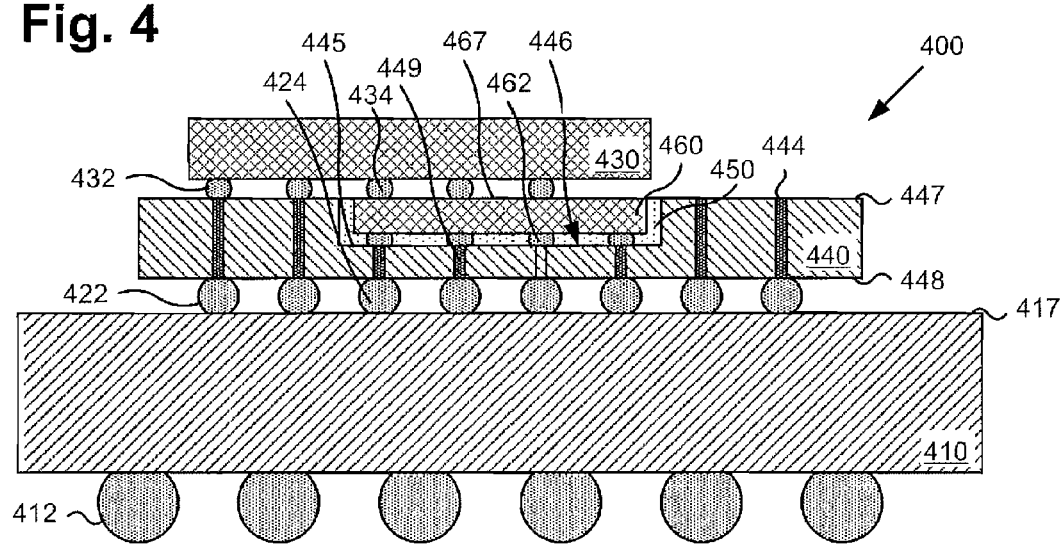
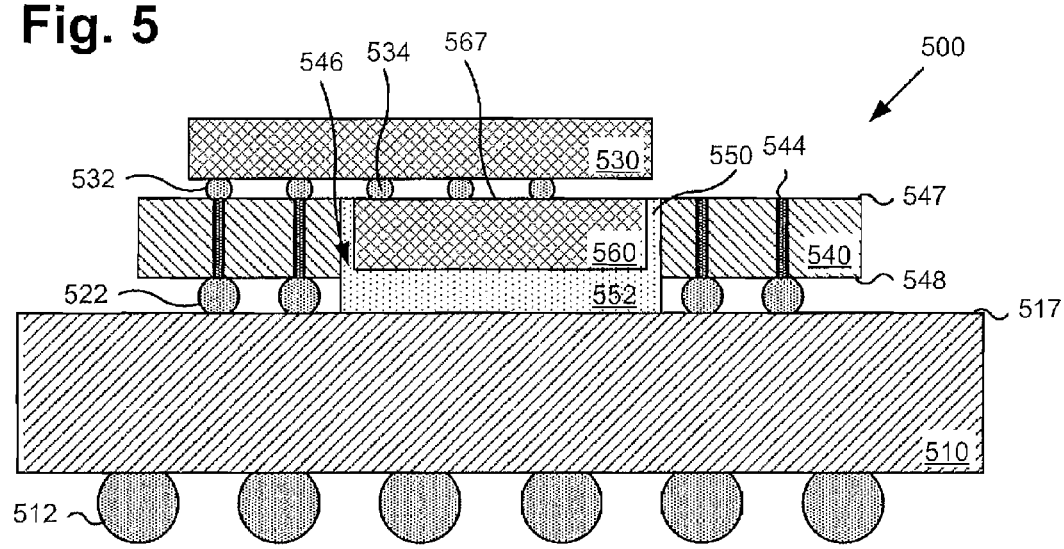

SEMICONDUCTOR INTERPOSER HAVING A CAVITY FOR INTRA-INTERPOSER DIE

BACKGROUND

As the speed, complexity, and functionality of semiconductor dies continue to increase, the interconnect requirements for semiconductor dies become increasingly complex. To accommodate increasingly complex interconnect requirements, conventional approaches have included using interposers to provide additional flexibility to distribute and route semiconductor die connections in semiconductor packages. However, using interposers can create unique problems when multiple dies are used in the same package. For example, when interposers are used to stack and interconnect multiple dies, the total thickness of the semiconductor packages may become unacceptably large.

In addition, the increase in semiconductor die speed, complexity, and functionality has led to an increase in total power dissipation within semiconductor packages. However, the thermal dissipation capabilities of conventional semiconductor packages employing interposers are inadequate. The inadequate thermal dissipation can result in thermal, electrical, or mechanical failure of the semiconductor dies and packages. Where multiple semiconductor dies are in the same package, inadequate thermal dissipation in one semiconductor die can also cause undesirable thermal stress in other semiconductor dies due to slow or uneven thermal dissipation in the semiconductor package.

SUMMARY

The present application is directed to a semiconductor interposer having a cavity for intra-interposer die, substantially as shown in and/or described in connection with at least one of the figures, and as set forth more completely in the claims.

BRIEF DESCRIPTION OF THE DRAWINGS

FIG. 4 illustrates an exemplary cross-sectional view of another semiconductor package including a semiconductor interposer having a cavity, according to one implementation of the present application.

FIG. 5 illustrates an exemplary cross-sectional view of another semiconductor package including a semiconductor interposer having a cavity, according to one implementation of the present application.

DETAILED DESCRIPTION

Figure 1:
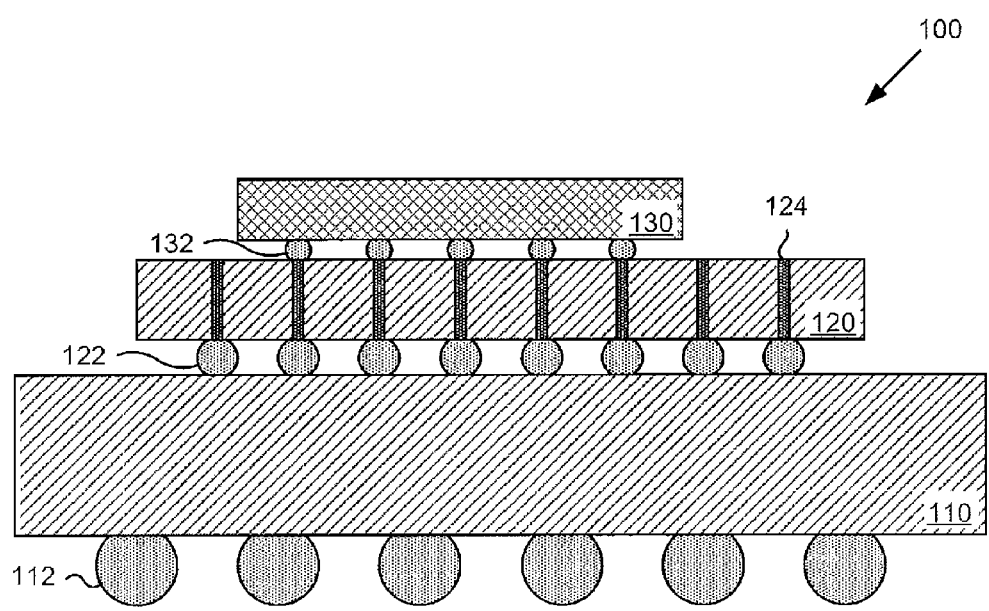
FIG. 1 illustrates an exemplary cross-sectional view of a conventional semiconductor package including a conventional interposer.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates an exemplary cross-sectional view of a conventional semiconductor package 100 including substrate 110, conventional interposer 120 disposed on substrate 110, and active die 130 disposed on conventional interposer 120. Interposers, such as conventional interposer 120, have typically been fabricated using a variety of materials, depending on the requirements of particular applications. For example, where conventional interposers require rigidity, materials such as silicon, FR4 (a glass-fiber reinforced epoxy laminate), may be used. Where conventional interposers require flexibility, materials such as polyimide may be used, for example. For interconnection between active die 130 and substrate 110, conventional interposer 120 may include several vias 124 filled with a conductive material. Several solder microbumps 132 or copper micro pillars may connect active die 130 with conventional interposer 120 and several solder bumps 122 may likewise connect conventional interposer 120 to substrate 110, for example. Where external connection of semiconductor package 100 is required, solder balls 112 may be disposed on a bottom surface of substrate 110.

In operation, conventional interposer 120 may route electrical connections on active die 130 to substrate 110 through vias 124, for example. However, the relatively narrow path provided by solder microbumps 132 may result in undesirably limited thermal conduction paths out of active die 130. Such inadequate thermal dissipation can result in thermal, electrical or mechanical failure of active die 130 and semiconductor package 100. If semiconductor package 100 is used to house multiple active dies, inadequate thermal dissipation from one active die, such as active die 130, may result in undesirable thermal stress in the other active dies in the semiconductor package. In addition, where conventional interposer 120 is used to stack and interconnect multiple active dies, the total thickness of semiconductor package 100 may become unacceptably large. Thus, conventional interposer designs fail to adequately accommodate increased thermal dissipation requirements, complexity and functionality of semiconductor packages.

Figure 2:
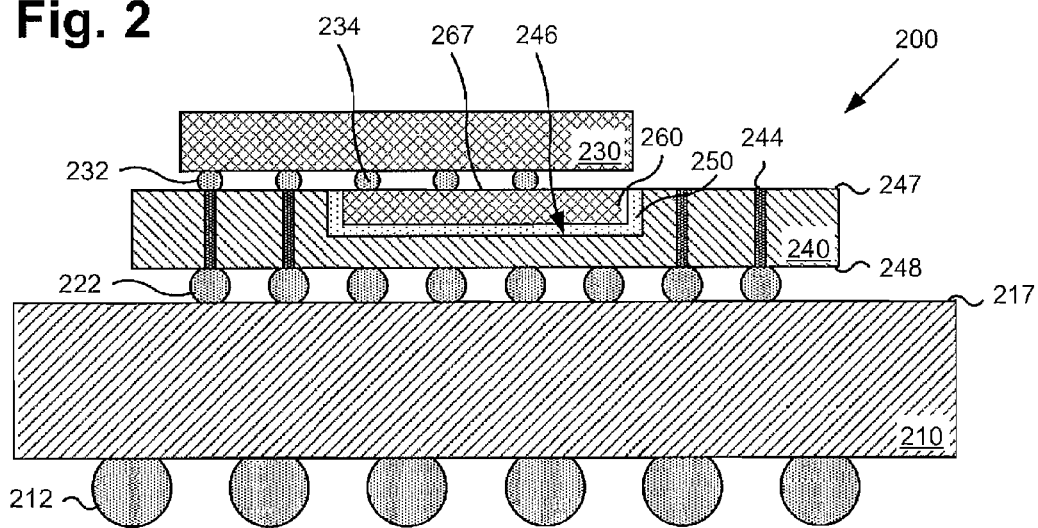
FIG. 2 illustrates an exemplary cross-sectional view of a semiconductor package including a semiconductor interposer having a cavity, according to one implementation of the present application.

FIG. 2 illustrates an exemplary cross-sectional view of a semiconductor package including a semiconductor interposer having a cavity, according to one implementation of the present application. Semiconductor package 200 may include substrate 210, semiconductor interposer 240 having cavity 246, intra-interposer die 260 disposed within cavity 246 of semiconductor interposer 240, and top die 230. Intra-interposer die 260 and top die 230 may be active dies, each containing one or more active components, such as one or more transistors, for example.

For interconnection between top die 230 and substrate 210, for example, semiconductor interposer 240 may include several through semiconductor vias (TSVs) 244. In one implementation, semiconductor interposer 240 may be a silicon interposer. In such an implementation, through semiconductor vias 244 may be referred to as through silicon vias 244. TSVs 244 may extend from top surface 247 to bottom surface 248 of semiconductor interposer 240 and may be formed by any appropriate technique known to those of ordinary skill in the art, for example, by deep reactive ion etching. In one implementation, TSVs 244 may be formed before cavity 246 is etched. In another implementation, TSVs 244 may be formed after cavity 246 is etched. Once formed, each of TSVs 244 may be lined by a dielectric and filled with a conductive filler.

Cavity 246 may be etched into semiconductor interposer 240 using any appropriate etching process known to those of ordinary skill in the art. Preferably, however, an anisotropic etching process is used in order to precisely control the dimensions of cavity 246. Non-limiting examples of suitable etching processes may include an $HNO_3$+HF wet etch, or a reactive ion dry etch. Once cavity 246 is formed in semiconductor interposer 240, thermally conductive adhesive 250 may be deposited in cavity 246 such that when intra-interposer die 260 is subsequently placed in cavity 246, the gap between intra-interposer die 260 and cavity 246 is completely filled with thermally conductive adhesive 250. Thus, in one implementation, thermally conductive adhesive 250 may contact intra-interposer die 260 on all sides except an exposed top surface 267. In such an implementation, thermally conductive adhesive 250 may also be an electrical insulator. The increased contact surface area between intra-interposer die 260 and thermally conductive adhesive 250 provides a much greater thermal dissipation capacity than conventional interposer structures. Thus, heat generated in intra-interposer die 260 may be easily transferred to semiconductor interposer 240 where it can also be transferred to substrate 210 through TSVs 244, or radiated directly to the ambient environment. In addition, mounting intra-interposer die 260 in cavity 246 of semiconductor interposer 240, rather than on top surface 247, serves to reduce the overall thickness of semiconductor package 200.

Semiconductor interposer 240 may be electrically and thermally connected to substrate 210 using several solder bumps 222, for example. In one specific example, solder bumps 222 may be 50 μm to 100 μm in diameter. However, solder bumps 222 may be any diameter suitable to a particular application.

Top die 230 may be electrically and thermally connected to semiconductor interposer 240 using several solder microbumps 232, for example. Additionally, one or more solder microbumps 234 may serve as a direct die-to-die electrical contact between top die 230 and intra-interposer die 260. Thus, where no direct electrical contact exists between intra-interposer die 260 and substrate 210, electrical communication between substrate 210 and intra-interposer die 260 may be achieved through electrical connection with top die 230. Finally, where external connection of semiconductor package 200 is required, several solder balls 212 may be deposited on a bottom surface of substrate 210.

Figure 3:
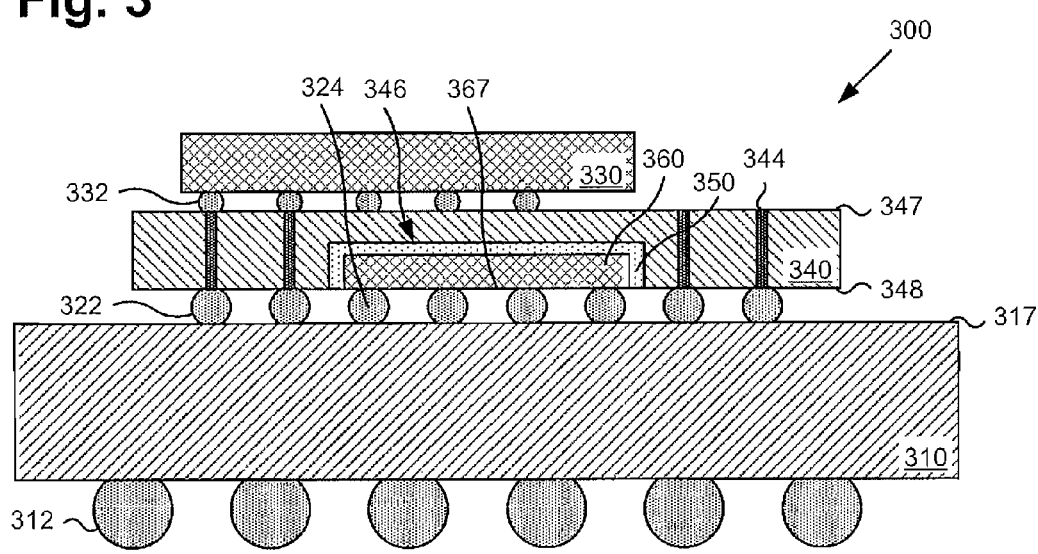
FIG. 3 illustrates an exemplary cross-sectional view of another semiconductor package including a semiconductor interposer having a cavity, according to one implementation of the present application.

FIG. 3 illustrates an exemplary cross-sectional view of another semiconductor package including a semiconductor interposer having a cavity, according to one implementation of the present application. Semiconductor package 300 is similar to that of semiconductor package 200 of FIG. 2, including a substrate 310, a semiconductor interposer 340 having a cavity 346, an intra-interposer die 360 disposed within cavity 346 of semiconductor interposer 340, and top die 330. However, semiconductor interposer 340 is flip-chip mounted to substrate 310 such that intra-interposer die 360, disposed within cavity 346, faces substrate 310. As in the implementation of FIG. 2, intra-interposer die 360 and top die 330 may be active dies, each containing one or more active components, such as one or more transistors, for example.

For interconnection between top die 330 and substrate 310, for example, semiconductor interposer 340 may include several through semiconductor vias (TSVs) 344. In one implementation, where semiconductor interposer 340 is a silicon interposer, through semiconductor vias 344 may be referred to as through silicon vias 344. TSVs 344 may extend from top surface 347 to bottom surface 348 of semiconductor interposer 340. TSVs 344 may be formed by any appropriate etch technique known to those of ordinary skill in the art, for example, deep reactive ion etching. In one implementation, TSVs 344 may be formed before cavity 346 is etched. In another implementation, TSVs 344 may be formed after cavity 346 is etched. Once formed, each of TSVs 344 may be lined by a dielectric and filled with a conductive filler.

Cavity 346 may be etched into semiconductor interposer 340 using any appropriate etching process known to those of ordinary skill in the art. Preferably, however, an anisotropic etching process is used in order to precisely control the dimensions of cavity 346. Once cavity 346 is formed in semiconductor interposer 340, a thermally conductive adhesive 350 may be deposited in cavity 346 such that when intra-interposer die 360 is subsequently placed in cavity 346, the gap between intra-interposer die 360 and cavity 346 may be completely filled with thermally conductive adhesive 350. Thus, in one implementation, thermally conductive adhesive 350 may contact intra-interposer die 360 on all sides except an exposed top surface 367, which faces substrate 310 when semiconductor interposer 340 is flip-chip mounted to substrate 310. In such an implementation, thermally conductive adhesive 350 may also be an electrical insulator. As in the implementation discussed in relation to FIG. 2, the increased contact surface area between intra-interposer die 360 and thermally conductive adhesive 350 provides a much greater thermal dissipation capacity than conventional interposer structures. In addition, mounting intra-interposer die 360 in cavity 346 of semiconductor interposer 340, rather than on top surface 347 or on bottom surface 348, serves to reduce the overall thickness of semiconductor package 300.

Semiconductor interposer 340 may be flip-chip mounted to substrate 310 using several solder bumps 322, providing an electrical and thermal connection to substrate 310. Intra-interposer die 360 may also be directly electrically and thermally connected to substrate 310 using several solder bumps 324, allowing additional heat transfer to take place directly to substrate 310 through solder bumps 322.

Top die 330 may be electrically and thermally connected to semiconductor interposer 340 using several solder microbumps 332. Because semiconductor interposer 340 is flip-chip mounted to substrate 310 such that cavity 346 faces substrate 310, semiconductor interposer 340 may also provide thermal isolation between intra-interposer die 360 and top die 330. Electrical communication between top die 330 and substrate may be achieved through TSVs 344 of flip-chip mounted semiconductor interposer 340. Finally, where external connection of semiconductor package 300 is required, several solder balls 312 may be deposited on the bottom surface of substrate 310.

FIG. 4 illustrates an exemplary cross-sectional view of another semiconductor package including a semiconductor interposer having a cavity, according to one implementation of the present application. Semiconductor package 400 is similar to that of semiconductor package 200 of FIG. 2, including a substrate 410, a semiconductor interposer 440 having a cavity 446, an intra-interposer die 460 disposed within cavity 446 of semiconductor interposer 440, and a top die 430. Intra-interposer die 460 and top die 430 may be active dies, each containing one or more active components, such as one or more transistors, for example.

For interconnection between top die 430 and substrate 410, for example, semiconductor interposer 440 may include several through semiconductor vias (TSVs) 444, extending from top surface 447 to bottom surface 448 of semiconductor interposer 440. For interconnection between intra-interposer die 460 and substrate 410, for example, semiconductor interposer 440 may also include several TSVs 449 disposed in cavity 446. TSVs 449 may extend from bottom surface 445 of cavity 446 to bottom surface 448 of semiconductor interposer 440. In one implementation, where semiconductor interposer 440 is a silicon interposer, through semiconductor vias 444 and 449 may be referred to as through silicon vias 444 and 449, respectively. TSVs 444 and 449 may be formed by any appropriate etch technique known to those of ordinary skill in the art, for example, deep reactive ion etching. In one implementation, TSVs 444 and/or TSVs 449 may be formed before cavity 446 is etched. In another implementation, TSVs 444 and/or TSVs 449 may be formed after cavity 446 is etched. However, TSVs 444 and TSVs 449 need not be formed in the same manufacturing process. Instead, TSVs 444 and TSVs 449 may be formed in separate etching processes. Once formed, each of TSVs 444 and TSVs 449 may be lined by a dielectric and filled with a conductive filler such as copper.

Cavity 446 may be etched into semiconductor interposer 440 using any appropriate etching process known to those of ordinary skill in the art. Preferably, however, an anisotropic etching process is used in order to precisely control the dimensions of cavity 446. Once cavity 446 is formed in semiconductor interposer 440, several solder microbumps 462 may be deposited in cavity 446 in order to electrically connect intra-interposer die 460 with one or more of TSVs 449, for example. A thermally conductive adhesive 450 may be deposited in cavity 446, around solder microbumps 462, such that when intra-interposer die 460 is subsequently placed in cavity 446, the gaps between intra-interposer die 460 and cavity 446 may be completely filled with thermally conductive adhesive 450. Thus, in one implementation, thermally conductive adhesive 450 may contact intra-interposer die 460 on all sides except an exposed top surface 467. In such an implementation, thermally conductive adhesive 450 may also be an electrical insulator to ensure electrical isolation between adjacent solder microbumps 462 as well as between intra-interposer die 460 and semiconductor interposer 440. As in FIG. 2, the increased contact surface area between intra-interposer die 460 and thermally conductive adhesive 450 provides a much greater thermal dissipation capacity than conventional interposer structures. In addition, mounting intra-interposer die 460 in a cavity of semiconductor interposer 440, rather than on top surface 447, serves to reduce the overall thickness of semiconductor package 400.

Semiconductor interposer 440 may be electrically and thermally connected to substrate 410 using solder bumps 422 and 424, for example. In such an implementation solder bumps 422 may electrically and thermally connect TSVs 444 to substrate 410, while solder bumps 424 may electrically and thermally connect TSVs 449 to substrate 410. Thus, additional thermal dissipation from intra-interposer die 460 may be provided directly to substrate 410 through TSVs 449.

Top die 430 may be electrically and thermally connected to semiconductor interposer 440 using several solder microbumps 432, for example. Thus, electrical communication between top die 430 and substrate may be achieved through TSVs 444 of semiconductor interposer 440. Additionally, one or more solder microbumps 434 may serve as a direct die-to-die electrical contact between top die 430 and intra-interposer die 460. Thus, intra-interposer die 460 may electrically communicate in two paths, directly with substrate 410 through TSVs 449, and directly with top die 430 through solder microbumps 434. Finally, where external connection of semiconductor package 200 is required, several solder balls 412 may be deposited on the bottom surface of substrate 410.

FIG. 5 illustrates an exemplary cross-sectional view of another semiconductor package including a semiconductor interposer having a cavity, according to one implementation of the present application. Semiconductor package 500 is similar to that of semiconductor package 200 of FIG. 2, including a substrate 510, a semiconductor interposer 540 having a cavity 546, an intra-interposer die 560 disposed within cavity 546 of semiconductor interposer 540, and a top die 530. Intra-interposer die 560 and top die 530 may be active dies, each containing one or more active components, such as one or more transistors, for example.

For interconnection between top die 530 and substrate 510, for example, semiconductor interposer 540 may include several through semiconductor vias (TSVs) 544. TSVs 544 may extend from top surface 547 to bottom surface 548 of semiconductor interposer 540. In one implementation, where semiconductor interposer 540 is a silicon interposer, through semiconductor vias 544 may be referred to as through silicon vias 544. TSVs 544 may be formed by any appropriate etch technique known to those of ordinary skill in the art, for example, deep reactive ion etching. In one implementation, TSVs 544 may be formed before cavity 546 is etched. In another implementation, TSVs 544 may be formed after cavity 546 is etched. Once formed, each of TSVs 544 may be lined by a dielectric and filled with a conductive filler.

Cavity 546 is similar to cavity 246 of FIG. 2, except that cavity 546 may be etched entirely through semiconductor interposer 540, extending from top surface 547 to bottom surface 548 of semiconductor interposer 540. Cavity 546 may be etched into semiconductor interposer 540 using any appropriate etching process known to those of ordinary skill in the art. Preferably, however, an anisotropic etching process is used in order to precisely control the dimensions of cavity 546.

Once cavity 546 is formed in semiconductor interposer 540, semiconductor interposer 540 may be electrically and thermally connected to substrate 510 using several solder bumps 522, for example. A thermal interface material (TIM) 552 may then be deposited between substrate 510 and semiconductor interposer 540 under cavity 546. TIM 552 may be the same material as thermally conductive adhesive 250 of FIG. 2, or may be a different thermally conductive material. A thermally conductive adhesive 550 may be deposited in cavity 546, over TIM 552, such that when intra-interposer die 560 is subsequently placed in cavity 546, the gap between intra-interposer die 560 and semiconductor interposer 540 may be completely filled with thermally conductive adhesive 550. In such an implementation, both thermal interface material 552 and thermally conductive adhesive 550 may be electrical insulators to ensure electrical isolation between intra-interposer die 560 and semiconductor interposer 540. As in FIG. 2, the increased contact surface area between intra-interposer die 560 and thermally conductive adhesive 550 provides greater thermal dissipation capacity than conventional interposer structures. TIM 552, being in physical contact with substantially the entire area of substrate 510 under cavity 546, also forms an increased contact surface area with substrate 510, providing further increased thermal dissipation capacity in semiconductor package 500. Mounting intra-interposer die 560 in cavity 546 of semiconductor interposer 540, rather than on top surface 547, serves to reduce the overall thickness of semiconductor package 500.

Top die 530 may be electrically and thermally connected to semiconductor interposer 540 using several solder microbumps 532, for example. Thus, electrical communication between top die 530 and substrate 510 may be achieved through TSVs 544 of semiconductor interposer 540. Top die 530 may also be electrically and thermally connected to intra-interposer die 560 using several solder microbumps 534, for example. Thus, where no direct electrical contact exists between intra-interposer die 560 and substrate 510, electrical communication between substrate 510 and intra-interposer die 560 may be achieved through electrical connections with top die 530. Finally, where external connection of semiconductor package 500 is required, array or matrix of solder balls 512 may be deposited on the bottom surface of substrate 510.

Thus, various implementations disclosed in the present application achieve a reduced semiconductor package thickness, as well as an increased thermal dissipation capability within the semiconductor package. The increased thermal dissipation capability advantageously reduces occurrence of thermal, electrical and mechanical failures of the semiconductor dies and semiconductor package, as compared to semiconductor packages including conventional interposers.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
  a substrate;
  a semiconductor interposer having a cavity, said cavity having a height from a first surface of said semiconductor interposer to a second surface of said semiconductor interposer;
  an intra-interposer die disposed within said cavity of said semiconductor interposer;
  a thermally conductive adhesive contacting first and second sides of said semiconductor interposer and said intra-interposer die;
  a die situated over said first surface of said semiconductor interposer;
  a first interconnect structure coupled to a first surface of said intra-interposer die and said die; and
  a second interconnect structure coupled to a second surface of said intra-interposer die and said semiconductor interposer,
  wherein said intra-interposer die is in electrical communication with said substrate situated below said second surface of said semiconductor interposer by a first electrical connection with said die using said first interconnect structure and by a second electrical connection through said semiconductor interposer using said second interconnect structure.

2. The semiconductor package of claim 1, further comprising:
  a first plurality of through semiconductor vias disposed in said semiconductor interposer, said first plurality of through semiconductor vias extending in length from said first surface of said semiconductor interposer to said second surface of said semiconductor interposer; and
  a second plurality of through semiconductor vias disposed in said semiconductor interposer, said second plurality of through semiconductor vias extending in length from a first surface of said cavity to said second surface of said semiconductor interposer,
  wherein said intra-interposer die is in electrical communication with said substrate through said first plurality of through semiconductor vias for said first electrical connection, and
  wherein said intra-interposer die is in electrical communication with said substrate through said second plurality of through semiconductor vias for said second electrical connection.

3. The semiconductor package of claim 2, further comprising:
  a third interconnect structure coupled to said die and said first surface of said semiconductor interposer; and
  a fourth interconnect structure coupled to said second surface of said semiconductor interposer and said substrate,
  wherein said third interconnect structure electrically connects said first plurality of through semiconductor vias to said die, and
  wherein said fourth interconnect structure electrically connects said first plurality of through semiconductor vias and said second plurality of through semiconductor vias to said substrate.

4. The semiconductor package of claim 3, wherein:
  said first interconnect structure and said third interconnect structure have a height smaller than that of said fourth interconnect structure, and
  said second interconnect structure has a height smaller than that of said fourth interconnect structure.

5. The semiconductor package of claim 1, further comprising:
  a plurality of through semiconductor vias disposed within said semiconductor interposer; and
  a conductive filler disposed in each of said plurality of through semiconductor vias.

6. The semiconductor package of claim 5, wherein one or more of said plurality of through semiconductor vias extend from said first surface of said semiconductor interposer to said second surface of said semiconductor interposer, said plurality of through semiconductor vias being electrically conductive.

7. The semiconductor package of claim 1, further comprising a thermal interface material disposed between said intra-interposer die and said substrate.

8. The semiconductor package of claim 7, wherein said thermal interface material is an electrical insulator and said thermal interface material is distinct from said thermally conductive adhesive, and wherein areas of said substrate and said thermal interface material that are in physical contact provide increased thermal dissipation capacity.

9. The semiconductor package of claim 1, further comprising a plurality of through semiconductor interposer vias extending between said first surface of said semiconductor interposer and said second surface of said semiconductor interposer.

10. The semiconductor package of claim 1, wherein said first interconnect structure comprises a first solder bump in physical contact with said intra-interposer die and said die, further comprising:
    a second solder bump in physical contact with said semiconductor interposer and said die; and
    a third solder bump in physical contact with said substrate and said semiconductor interposer,
    wherein said first and second solder bumps are smaller than said third solder bump.

11. The semiconductor package of claim 1, wherein said thermally conductive adhesive is in contact with said second interconnect structure.

12. A semiconductor package comprising:
    a substrate;
    a semiconductor interposer having a cavity therein, said semiconductor interposer situated over said substrate;
    said semiconductor interposer comprising a plurality of through semiconductor vias;
    an intra-interposer die disposed within said cavity of said semiconductor interposer;
    a thermally conductive adhesive contacting said semiconductor interposer and said intra-interposer die;
    a die situated over said semiconductor interposer;
    a first interconnect structure coupled to a first surface of said intra-interposer die and said die; and
    a second interconnect structure coupled to a second surface of said intra-interposer die and said semiconductor interposer,
    wherein said intra-interposer die is in electrical communication with said substrate by a first electrical connection with said die using said first interconnect structure and by a second electrical connection through said semiconductor interposer using said second interconnect structure.

13. The semiconductor package of claim 12, wherein said plurality of through semiconductor vias comprises:
    a first plurality of through semiconductor vias that extend from said first surface of said semiconductor interposer to said second surface of said semiconductor interposer; and
    a second plurality of through semiconductor vias that extend from a first surface of said cavity to said second surface of said semiconductor interposer,
    wherein said intra-interposer die is in electrical communication with said substrate through said first plurality of through semiconductor vias for said first electrical connection, and
    wherein said intra-interposer die is in electrical communication with said substrate through said second plurality of through semiconductor vias for said second electrical connection.

14. The semiconductor package of claim 13, further comprising:
    a third interconnect structure coupled to said die and said first surface of said semiconductor interposer; and
    a fourth interconnect structure coupled to said second surface of said semiconductor interposer and said substrate,
    wherein said third interconnect structure electrically connects said first plurality of through semiconductor vias to said die, and wherein said fourth interconnect structure electrically connects said first plurality of through semiconductor vias and said second plurality of through semiconductor vias to said substrate.

15. The semiconductor package of claim 14, wherein:
    said first interconnect structure and said third interconnect structure have a height smaller than that of said fourth interconnect structure, and
    said second interconnect structure has a height smaller than that of said fourth interconnect structure.

16. The semiconductor package of claim 12, further comprising a thermal interface material disposed between said intra-interposer die and said substrate.

17. The semiconductor package of claim 16, wherein the thermal interface material is an electrical insulator.

18. The semiconductor package of claim 12, wherein said die is electrically connected to said substrate through one or more of said plurality of through semiconductor vias.

19. The semiconductor package of claim 12, wherein said intra-interposer die is electrically connected to said substrate through one or more of said plurality of through semiconductor vias.

20. The semiconductor package of claim 12, where said thermally conductive adhesive within said cavity is an electrical insulator.

21. A semiconductor package comprising:
    a substrate;
    a silicon interposer having a cavity therein, said silicon interposer situated over said substrate;
    said silicon interposer comprising a plurality of through silicon vias;
    an intra-interposer die disposed within said cavity of said silicon interposer;
    a thermally conductive adhesive contacting said silicon interposer and said intra-interposer die; and
    a die situated over said silicon interposer
    a first interconnect structure coupled to a first surface of said intra-interposer die and said die; and
    a second interconnect structure coupled to a second surface of said intra-interposer die and said silicon interposer,
    wherein said intra-interposer die is in electrical communication with said substrate by a first electrical connection with said die using said first interconnect structure and by a second electrical connection through said silicon interposer using said second interconnect structure.

22. The semiconductor package of claim 21, wherein said plurality of through silicon vias comprises:
    a first plurality of through silicon vias that extend from a first surface of said silicon interposer to a second surface of said silicon interposer; and
    a second plurality of through silicon vias that extend from a first surface of said cavity to said second surface of said silicon interposer,
    wherein said intra-interposer die is in electrical communication with said substrate through said first plurality of through silicon vias for said first electrical connection, and
    wherein said intra-interposer die is in electrical communication with said substrate through said second plurality of through silicon vias for said second electrical connection.

23. The semiconductor package of claim 22, further comprising:
    a third interconnect structure coupled to said die and said first surface of said silicon interposer; and a fourth interconnect structure coupled to said second surface of said silicon interposer and said substrate, wherein said third interconnect structure electrically connects said first plurality of through semiconductor vias to said die, and wherein said fourth interconnect structure electrically connects said first plurality of through semiconductor vias and said second plurality of through semiconductor vias to said substrate.

24. The semiconductor package of claim 23, wherein:

said first interconnect structure and said third interconnect structure have a height smaller than that of said fourth interconnect structure, and said second interconnect structure has a height smaller than that of said fourth interconnect structure.

25. The semiconductor package of claim 21, wherein said die is electrically connected to said substrate through one or more of said plurality of through silicon vias.

26. The semiconductor package of claim 21, wherein said intra-interposer die is electrically connected to said substrate through one or more of said plurality of through silicon vias.

27. The semiconductor package of claim 21, further comprising a thermal interface material disposed between said intra-interposer die and said substrate.

28. The semiconductor package of claim 21, wherein said thermally conductive adhesive within said cavity is an electrical insulator.

\* \* \* \* \*